US012761280B2

(12) United States Patent
Park

(10) Patent No.: US 12,761,280 B2
(45) Date of Patent: Oct. 13, 2026

(54) DIAGNOSIS DEVICE AND METHOD FOR BATTERY SYSTEM

(71) Applicant: LG Energy Solution, Ltd., Seoul (KR)

(72) Inventor: Hangon Park, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 251 days.

(21) Appl. No.: 18/835,083

(22) PCT Filed: Jul. 3, 2023

(86) PCT No.: PCT/KR2023/009313
§ 371 (c)(1),
(2) Date: Aug. 1, 2024

(87) PCT Pub. No.: WO2024/029754
PCT Pub. Date: Feb. 8, 2024

(65) Prior Publication Data

US 2025/0155508 A1 May 15, 2025

(30) Foreign Application Priority Data

Aug. 3, 2022 (KR) ........................ 10-2022-0096681

(51) Int. Cl.
*G01N 27/416* (2006.01)
*G01R 31/367* (2019.01)
(Continued)

(52) U.S. Cl.
CPC ......... *G01R 31/367* (2019.01); *G01R 31/392* (2019.01); *H01M 10/4285* (2013.01)

(58) Field of Classification Search
CPC .... G01R 31/36; G01R 31/367; G01R 31/382; G01R 31/392; G01R 31/396;
(Continued)

(56) References Cited

U.S. PATENT DOCUMENTS 5,684,404 A * 11/1997 Millar ................ G01R 31/3648 324/426
10,746,802 B2 8/2020 Cho et al.
(Continued)

FOREIGN PATENT DOCUMENTS

CN 114460485 A 5/2022
CN 114487860 A 5/2022
(Continued)

OTHER PUBLICATIONS

International Search Report for Application No. PCT/KR2023/009313 mailed Oct. 12, 2023, pp. 1-4.
(Continued)

*Primary Examiner* — Thang X Le
(74) *Attorney, Agent, or Firm* — Lerner David LLP

(57) ABSTRACT

A diagnosing apparatus and method for diagnosing a failure of a component included in a battery system may monitor whether an abnormal state of the component occurs based on abnormal state data of the component, upon abnormal state occurring in the component, measure a time duration for which the abnormal state is maintained, compare the time duration for which the abnormal state is maintained to a preset reference time duration, and, upon the time duration for which the abnormal state is maintained being shorter than the reference time duration, check whether a predetermined early stage diagnosis condition is satisfied based on the time duration for which the abnormal state is maintained, and determine whether or not a component failure has occurred according to whether or not the early stage diagnosis condition is satisfied.

16 Claims, 6 Drawing Sheets

(51) Int. Cl.
*G01R 31/392* (2019.01)
*H01M 10/42* (2006.01)

(58) Field of Classification Search
CPC .... H01M 10/48; H01M 10/42; H01M 10/425; H01M 10/4285; H01M 10/482; H01M 2220/20; B60L 58/10
See application file for complete search history.

(56) References Cited

U.S. PATENT DOCUMENTS

| | | | | |
|---|---|---|---|---|
| 11,858,007 | B2 | 1/2024 | Ito et al. | |
| 11,995,919 | B2 | 5/2024 | Haga | |
| 2016/0266213 | A1 | 9/2016 | Kim | |
| 2020/0124672 | A1 | 4/2020 | Cho et al. | |
| 2021/0231738 | A1* | 7/2021 | Li | G01R 31/371 |
| 2021/0286020 | A1 | 9/2021 | Tawa et al. | |
| 2022/0221527 | A1* | 7/2022 | Yoon | G01R 31/367 |
| 2022/0390521 | A1 | 12/2022 | Kim et al. | |
| 2023/0056920 | A1* | 2/2023 | Nam | G01K 3/08 |

FOREIGN PATENT DOCUMENTS

| | | | |
|---|---|---|---|
| JP | H01234018 | A | 9/1989 |
| JP | H10331706 | A | 12/1998 |
| JP | 2003009405 | A | 1/2003 |
| JP | 3906521 | B2 | 4/2007 |
| JP | 2007166815 | A | 6/2007 |
| JP | 2013000407 | A | 1/2013 |
| JP | 2016043892 | A | 4/2016 |
| JP | 2020020732 | A | 2/2020 |
| JP | 2020087593 | A | 6/2020 |
| JP | 2022021629 | A | 2/2022 |
| KR | 19980051113 | A | 9/1998 |
| KR | 20020049282 | A | 6/2002 |
| KR | 20120061660 | A | 6/2012 |
| KR | 20150101200 | A | 9/2015 |
| KR | 20150101203 | A | 9/2015 |
| KR | 20150118429 | A | 10/2015 |
| KR | 20160110700 | A | 9/2016 |
| KR | 20180008224 | A | 1/2018 |
| KR | 102229019 | B1 | 3/2021 |
| KR | 102254734 | B1 | 5/2021 |
| KR | 20210080326 | A | 6/2021 |
| KR | 102315860 | B1 | 10/2021 |
| KR | 20210125313 | A | 10/2021 |
| KR | 20210141212 | A | 11/2021 |
| KR | 20210158123 | A | 12/2021 |
| KR | 20220068368 | A | 5/2022 |

OTHER PUBLICATIONS

Extended European Search Report for Application No. 23850264.5 dated Jun. 4, 2025, 5 pages.

* cited by examiner

[Figure 1]
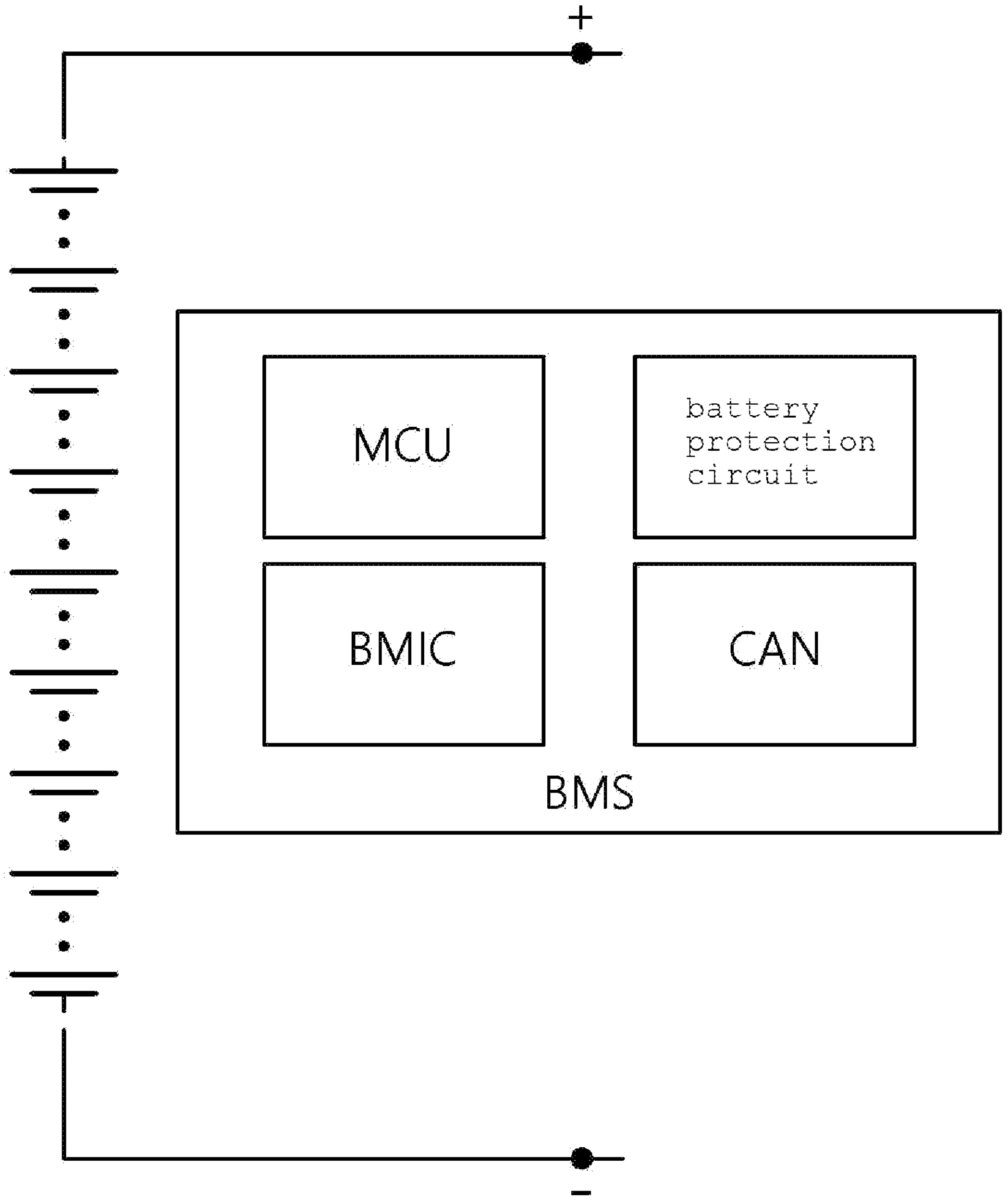

[Figure 2]
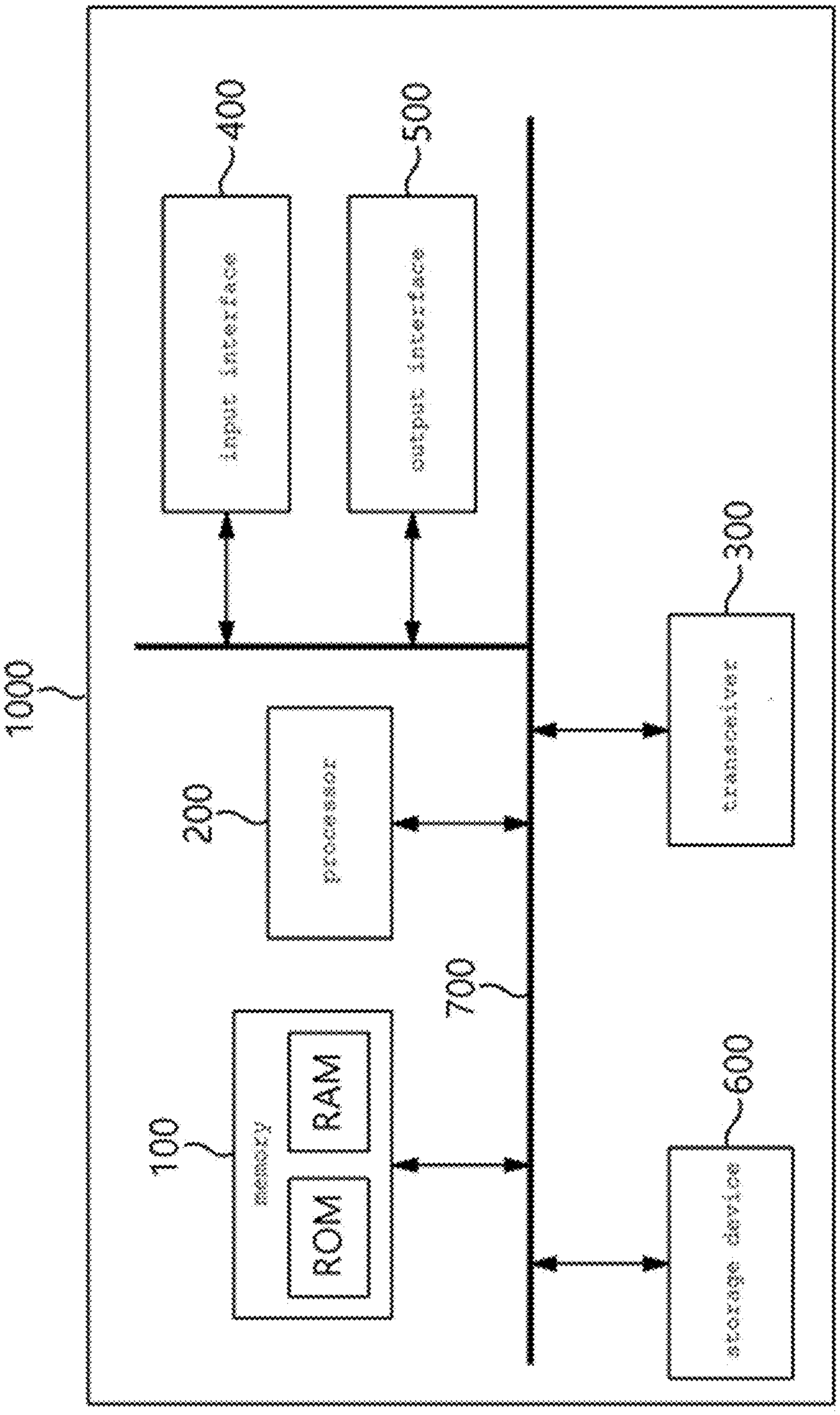

[Figure 3]
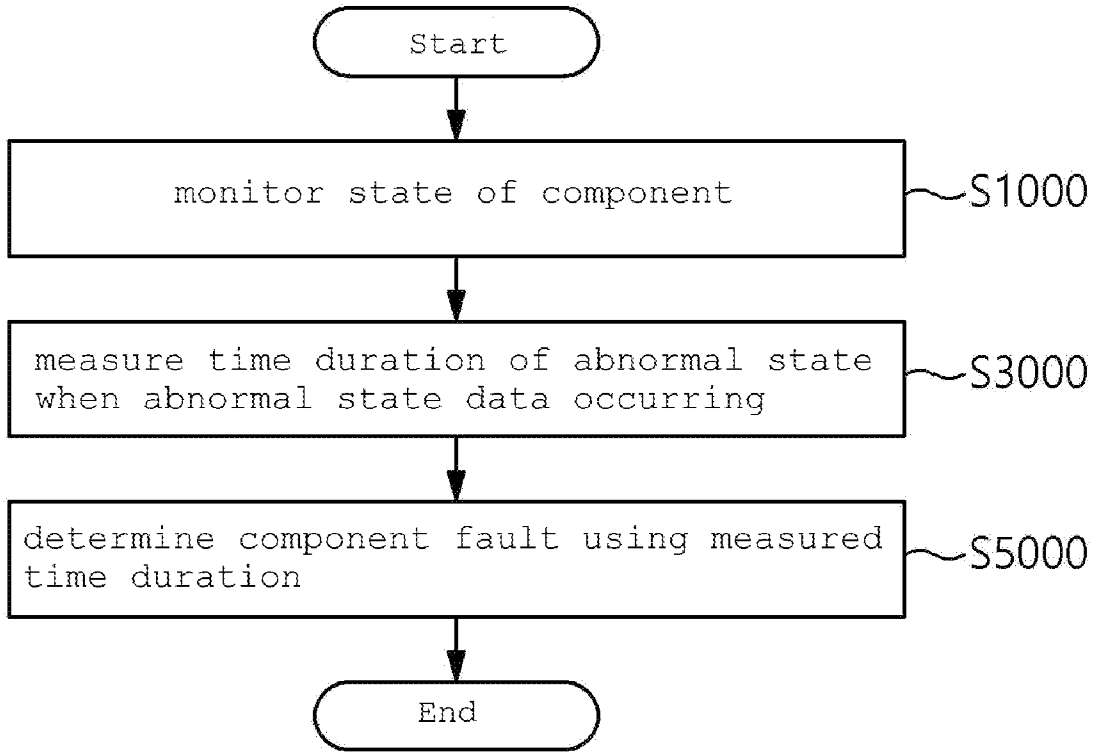

[Figure 4]
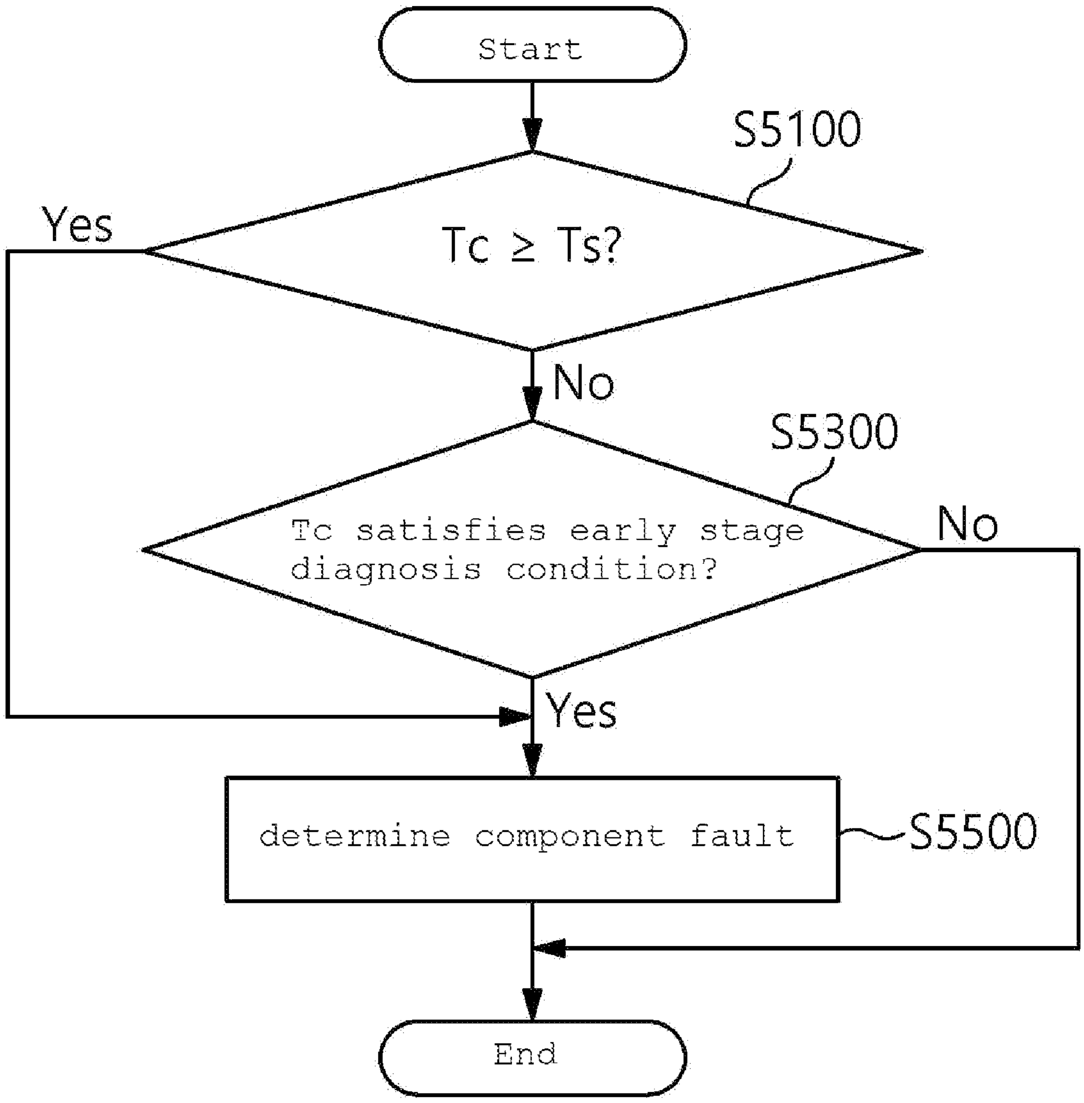

[Figure 5]
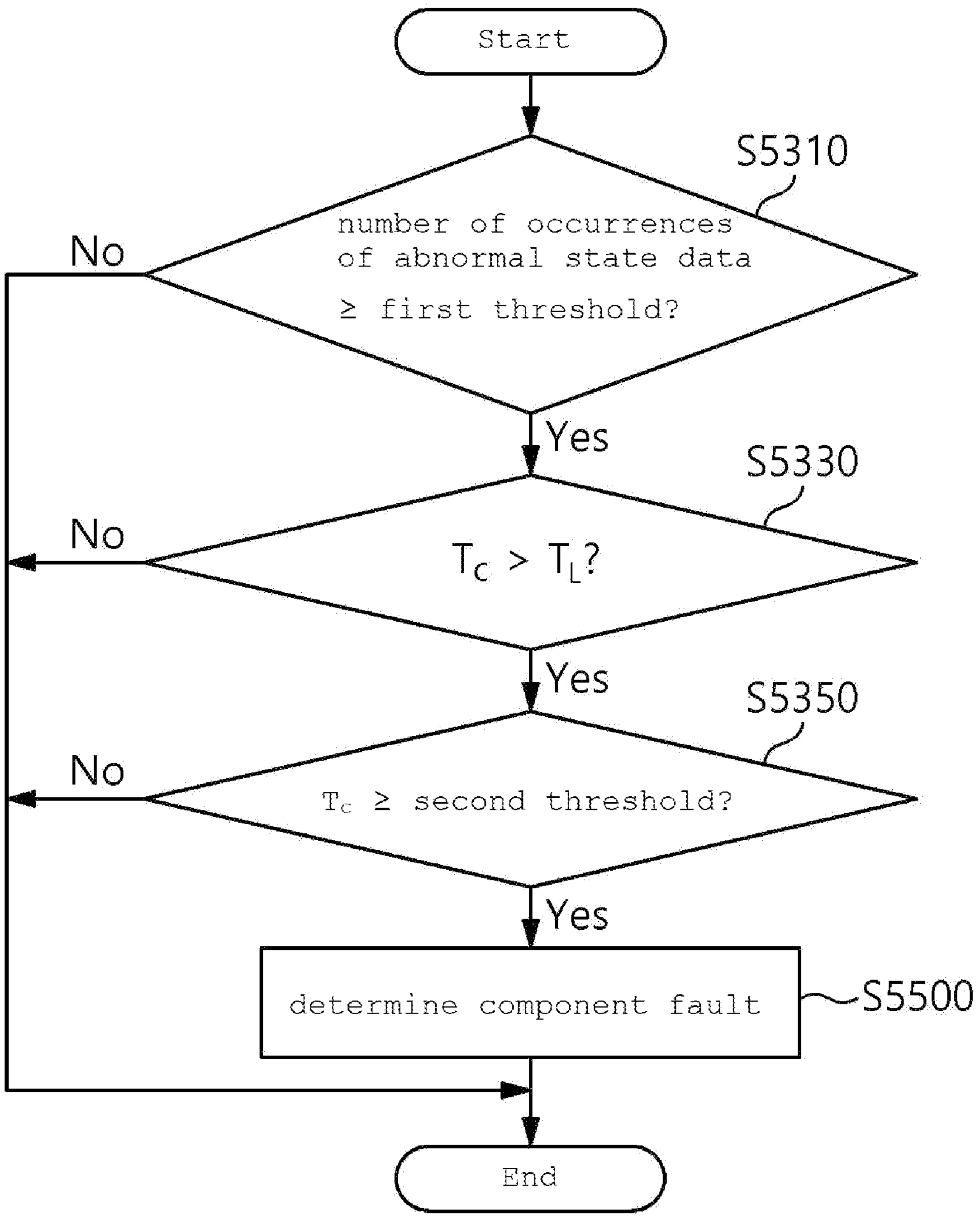

[Figure 6]
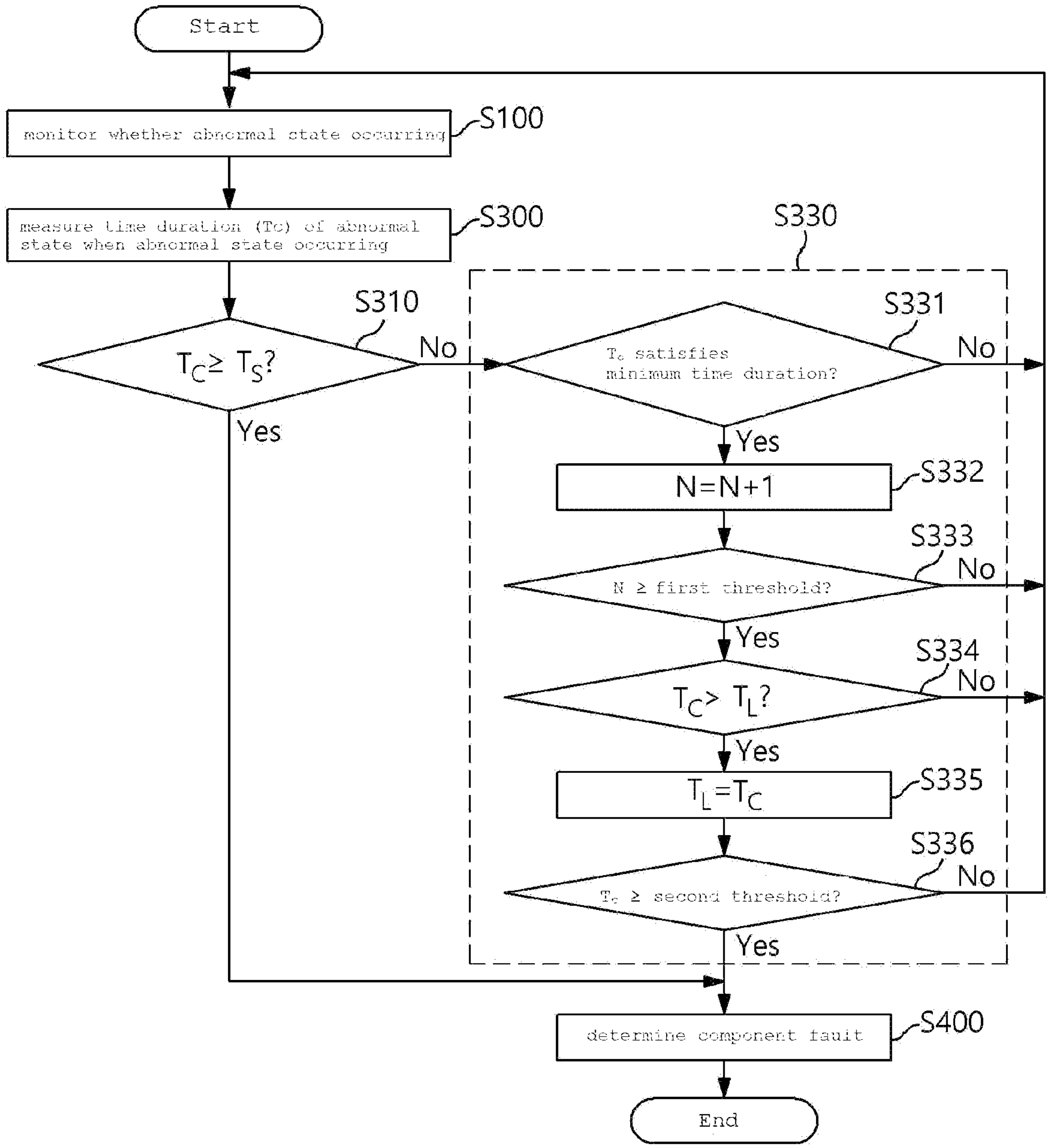

DIAGNOSIS DEVICE AND METHOD FOR BATTERY SYSTEM

CROSS REFERENCE TO THE RELATED APPLICATIONS

The present application is a national phase entry under 35 U.S.C. § 371 of International Application No. PCT/KR2023/009313, filed on Jul. 3, 2023, which claims priority from Korean Patent Application No. 10-2022-0096681, filed on Aug. 3, 2022, all of which are hereby incorporated herein by reference in their entireties.

TECHNICAL FIELD

The present invention relates to an apparatus and method for diagnosing a battery system, and more particularly, to an apparatus and method for diagnosing a fault in a component included in a battery system.

BACKGROUND

Recently, due to depletion of fossil energy and environmental pollution, interest in electric vehicles using electric energy without using fossil energy is increasing.

In general, an electric vehicle operates a drive motor that requires high output for driving. Accordingly, an electric vehicle uses a battery pack in which a plurality of battery cells are connected in series and uses electricity output from the battery pack as an energy source.

In other words, since the performance of a battery directly affects the performance of a vehicle using electric energy, it is essentially required to monitor states of battery cells and electric components by measuring voltage and current states of battery cells and operating states of electric components.

Meanwhile, when an abnormality occurs in at least one hardware component in an electric vehicle, a conventional diagnosing apparatus determines it as a failure only when the abnormality continuously occurs for a preset maintaining time.

In a conventional diagnosing apparatus, when the maintaining time is set to be long, minor failures in components cannot be detected, which leads to a disadvantage of making preemptive diagnosis difficult whereas when the maintaining time is set to be short, noise signals from the external environment may be misdetected as a failure, which leads to a disadvantage of lowering reliability.

SUMMARY OF THE INVENTION

To obviate one or more problems of the related art, embodiments of the present disclosure provide an apparatus of diagnosing a battery system with high-performance, high-precision, high-efficiency, and high-reliability.

To obviate one or more problems of the related art, embodiments of the present disclosure also provide a method of diagnosing a battery system with high-performance, high-precision, high-efficiency, and high-reliability.

In order to achieve the objective of the present disclosure, a method of diagnosing a battery system may include monitoring whether a component included in the battery system is in an abnormal state based on abnormal state data of the component; in response to the component being in the abnormal state, measuring a time duration for which the component is in the abnormal state; comparing the time duration for which the component is in the abnormal state to a preset reference time duration; and in response to the time duration for which the component is in the abnormal state being shorter than the reference time duration, determining whether a predetermined early stage diagnosis condition is satisfied according to the time duration for which the component is in the abnormal state and determining whether or not a component failure has occurred based on to whether or not the early stage diagnosis condition is satisfied.

The early stage diagnosis condition may include at least one of a first condition in which a number of abnormal state occurrences is greater than or equal to a first predefined threshold, a second condition in which the time duration for which the component is in the abnormal state exceeds an updatable previously stored longest time duration, and a third condition in which the time duration for which the component is in the abnormal state is longer than or equal to a fixed second predetermined threshold.

Determining whether or not the component failure has occurred may include: counting the number of abnormal state occurrences for which the time duration for which the component is in the abnormal state is longer than or equal to a predetermined minimum time duration.

The predetermined minimum time duration may be a value between 0.4 times to 0.6 times the reference time duration.

The method may further include: in response to the time duration for which the component is in the abnormal state exceeding the previously stored longest time duration, updating the previously stored longest time duration with the time duration for which the component is in the abnormal state.

The second threshold may be a value between 0.7 times to 0.9 times the reference time duration.

The method may further include determining that the component failure has occurred in response to the time duration for which the component is in the abnormal state is longer than or equal to the reference time duration.

Determining whether or not the component failure has occurred may be performed using early stage diagnosis in response to the first condition, the second condition, and the third condition being satisfied regardless of whether the time duration for which the component is in the abnormal state is shorter than the reference time duration.

According to another embodiment of the present disclosure, an apparatus of diagnosing a battery system may include at least one processor and a memory configured to store instructions executed by the at least one processor, and the instructions may cause the at least one processor to: monitor whether a component included in the battery system is in an abnormal state based on abnormal state data of the component; in response to the component being in the abnormal state, measure a time duration for which the component is in the abnormal state; compare the time duration for which the component is in the abnormal state to a preset reference time duration; and in response to the time duration for which the component is in the abnormal state being shorter than the reference time duration, determine whether a predetermined early stage diagnosis condition is satisfied according to the time duration for which the component is in the abnormal state and determining whether or not a component failure has occurred based on to whether or not the early stage diagnosis condition is satisfied.

Furthermore, the early stage diagnosis condition may include at least one of a first condition in which a number of abnormal state occurrences is greater than or equal to a first predefined threshold, a second condition in which the time duration for which the component is in the abnormal state exceeds an updatable previously stored longest time duration, and a third condition in which the time duration for which the component is in the abnormal state is longer than or equal to a fixed second predetermined threshold.

In addition, the instructions may cause the at least one processor to count the number of abnormal state occurrences for which the time duration for which the component is in the abnormal state is longer than or equal to a predetermined minimum time duration.

Here, the predetermined minimum time duration may be a value between 0.4 times to 0.6 times the reference time duration.

Furthermore, the instructions may cause the at least one processor to in response to the time duration for which the component is in the abnormal state exceeding the previously stored longest time duration, update the previously stored longest time duration with the time duration for which the component is in the abnormal state.

Meanwhile, the second threshold may be a value between 0.7 times to 0.9 times the reference time duration.

Furthermore, the instructions may cause the at least one processor to determine that the component failure has occurred in response to the time duration for which the component is in the abnormal state is longer than or equal to the reference time duration.

In addition, the instructions may cause the at least one processor to determine that the component failure has occurred using early stage diagnosis in response to the first condition, the second condition, and the third condition being satisfied regardless of whether the time duration for which the component is in the abnormal state is shorter than the reference time duration.

According to embodiments of the present invention, a diagnosing apparatus and method for diagnosing a failure of a component included in a battery system may monitor whether an abnormal state of the component occurs based on abnormal state data of the component, upon abnormal state occurring in the component, measure a time duration for which the abnormal state is maintained, compare the time duration for which the abnormal state is maintained to a preset reference time duration, and, upon the time duration for which the abnormal state is maintained being shorter than the reference time duration, check whether a predetermined early stage diagnosis condition is satisfied based on the time duration for which the abnormal state is maintained and determining whether or not a component failure has occurred according to whether or not the early stage diagnosis condition is satisfied, thereby enabling preemptive response by early stage diagnosis of failure even for temporary abnormal state data which lasts shorter than a preset reference time and providing high-performance, high-precision, high-efficiency, and high-reliability diagnostic devices and methods.

BRIEF DESCRIPTION OF THE DRAWINGS

FIG. 1 is a block diagram of a battery system to which embodiments of the present invention may be applied.

FIG. 2 is a block diagram of an apparatus of diagnosing a battery system according to embodiments of the present invention.

FIG. 3 is a flowchart illustrating a method of diagnosing a battery system according to embodiments of the present invention.

FIG. 4 is a flowchart illustrating a method of determining whether a malfunction is present in the component in the method of diagnosing a battery system according to embodiments of the present invention.

FIG. 5 is a flowchart illustrating an early stage diagnosis condition in the method of diagnosing a battery system according to embodiments of the present invention.

FIG. 6 is a flowchart illustrating a method of diagnosing a battery system according to embodiments of the present invention.

| | |
|---|---|
| 1000: apparatus of diagnosing battery system | |
| 100: memory | 200: processor |
| 300: transceiver | |
| 400: input interface | |
| 500: output interface | |
| 600: storage device | |
| 700: bus | |

DETAILED DESCRIPTION

The present invention may be modified in various forms and have various embodiments, and specific embodiments thereof are shown by way of example in the drawings and will be described in detail below. It should be understood, however, that there is no intent to limit the present invention to the specific embodiments, but on the contrary, the present invention is to cover all modifications, equivalents, and alternatives falling within the spirit and technical scope of the present invention. Like reference numerals refer to like elements throughout the description of the figures.

It will be understood that, although the terms such as first, second, A, B, and the like may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes combinations of a plurality of associated listed items or any of the plurality of associated listed items.

It will be understood that when an element is referred to as being "coupled" or "connected" to another element, it can be directly coupled or connected to the other element or an intervening element may be present. In contrast, when an element is referred to as being "directly coupled" or "directly connected" to another element, there is no intervening element present.

The terms used herein is for the purpose of describing specific embodiments only and are not intended to limit the present invention. As used herein, the singular forms "a", "an" and "the" are intended to include the plural forms as well, unless the context clearly indicates otherwise. It will be further understood that the terms "comprises", "comprising", "includes", "including" and/or "having", when used herein, specify the presence of stated features, integers, steps, operations, constitutional elements, components and/or combinations thereof, but do not preclude the presence or addition of one or more other features, integers, steps, operations, constitutional elements, components, and/or combinations thereof.

Unless otherwise defined, all terms used herein, including technical and scientific terms, have the same meanings as commonly understood by one skilled in the art to which the present invention belongs. It will be further understood that terms, such as those defined in commonly used dictionaries, should be interpreted as having meanings that are consistent with their meanings in the context of the relevant art and will not be interpreted in an idealized or overly formal sense unless expressly so defined herein.

Hereinafter, exemplary embodiments of the present invention will be described in detail with reference to the accompanying drawings.

FIG. 1 is a block diagram of a battery system to which embodiments of the present invention may be applied.

Referring to FIG. 1, a battery pack or battery module may include a plurality of battery cells connected in series. The battery pack or module may be connected to a load through a positive terminal and a negative terminal to perform charging or discharging. The most commonly used battery cell is a lithium-ion (Li-Ion) battery cell.

A battery management system (BMS) 100 may be connected to a battery module or battery pack.

The battery management system may monitor a current, a voltage and a temperature of each battery cell or module to be managed, calculate a state of charge (SOC) of the battery based on monitoring results to control charging and discharging. Here, the State of Charge (SOC) refers to a current state of charge of a battery, represented in percent points [%], and the State of Health (SOH) may be a current condition of a battery compared to its ideal conditions, represented in percent points [%].

The BMS may monitor battery cells, read cell voltages, and transmit them to other systems connected to the battery.

Furthermore, the battery management system monitors at least one electrical component constituting the battery system and passes their status data on to other systems. For this, the BMS includes a communication module for communicating with other systems in a device including the battery system.

The communication module of the BMS can communicate with other systems in the device using CAN (Controller Area Network). Here, components, modules or systems in the BMS are connected to each other through a CAN bus. Accordingly, the battery management system (BMS) may use CAN communication to remotely transmit status data obtained through monitoring of the battery pack or module and at least one electrical component constituting the battery management system (BMS) to other systems.

Furthermore, the battery management system (BMS) may equally balance charges of the battery cells in order to extend the life of the battery system.

The BMS 100 may include various components such as a fuse, a current sensing element, a thermistor, a switch, and a balancer to perform such operations. In most cases, a micro controller unit (MCU) or a battery monitoring integrated chip (BMIC) for interworking and controlling these components is additionally included in the BMS. Here, the BMIC may be located inside the BMS and may be an integrated circuit (IC) type component that measures information such as voltage, temperature, and current of a battery cell/module. According to embodiments, a battery management system (BMS) may be applied to a vehicle.

Meanwhile, in general, a battery management system (BMS) may be interlocked with a battery protection device, which blocks a charge/discharge circuit when an abnormality occurs in a battery. In other words, when an abnormality occurs in any one battery cell or module, the conventional battery protection circuit blocks the charge/discharge circuit to limit use of the battery.

FIG. 2 is a block diagram of an apparatus of diagnosing a battery system according to embodiments of the present invention.

Referring to FIG. 2, the apparatus of diagnosing a battery system 1000 may be a component of the battery management system (BMS). Accordingly, the diagnosis apparatus 1000 may diagnose a failure occurring in a component included in the battery system. Here, the component included in the battery system may be any one of a battery cell, a battery module, and at least one electric component therein.

In more detail, the apparatus of diagnosing a battery system 1000 may monitor whether or not abnormal state data outside a preset condition value is generated based on state data transmitted from at least one component included in the battery system.

In addition, the diagnosis device 1000 can diagnose whether or not a corresponding component has a failure at an early stage based on an anomaly that occurs while monitoring the state of a component.

More specifically, when abnormal state data out of a preset condition range is generated in a component included in the battery system, the apparatus 1000 of diagnosing a battery system may measure a time duration during which the abnormal state data is continuously maintained. Thereafter, when the time duration during which the abnormal state data is maintained is shorter than a predetermined reference time duration and an early stage diagnosis condition is satisfied, the apparatus 1000 of diagnosing a battery system may diagnose whether the component is out of order at an early stage based on the time duration.

In contrast, generally, when abnormal state data is generated in any one of at least one component constituting the battery system, a typical diagnosing apparatus diagnoses that the corresponding component is out of order only when the abnormal state data lasts longer than a predetermined reference time duration. In other words, as to the typical diagnosing apparatus, the reliability of the diagnosis result or the stability of use is determined according to a set reference time duration.

For example, in more detail, when the reference time duration is set short in a typical diagnosing apparatus to increase safety of at least one component constituting the battery system, abnormal state data may be generated by temporary noise phenomena and the corresponding component may be mistakenly judged as having failure because of the abnormal state data, resulting in decreased reliability.

In contrast, when setting a long reference time duration to ignore abnormal state data generated by temporary noise in order to increase reliability, the typical diagnosing apparatus cannot detect abnormal state data caused by failures early, which renders a preemptive response difficult.

Meanwhile, the battery system diagnosing apparatus 1000 according to embodiments of the present invention may determine a failure, like a conventional diagnosis apparatus, when the time duration of abnormal state data for at least one component included in the battery system is equal to or longer than a predetermined reference time. In addition, even when the time duration of the abnormal state data is shorter than the reference time, it is possible to preemptively respond to a failure by determining whether the component has a failure according to whether an early stage diagnosis condition is satisfied.

In more detail as to each component of the battery system diagnosing apparatus 1000 according to embodiments of the present invention, the battery system diagnosing apparatus 1000 may include a memory 100, a processor 200, a transceiver 300, an input interface 400, an output interface 500, and a storage device 600.

According to embodiments, respective components 100, 200, 300, 400, 500, 600 included in the battery system 1000 may be connected by a bus 700 to communicate with each other.

The memory 100 and the storage device 600 among the components 100, 200, 300, 400, 500, 600 may include at least one of a volatile storage medium and a non-volatile storage medium. For example, the memory 100 and the storage device 600 may include at least one of read only memory (ROM) and random access memory (RAM).

Among them, the memory 100 may include at least one instruction executed by the processor 200.

According to embodiments, the at least one instruction may include: an instruction to monitor whether an abnormal state of the component occurs based on abnormal state data of the component; an instruction to, upon abnormal state occurring in the component, measure a time duration for which the abnormal state is maintained; an instruction to compare the time duration for which the abnormal state is maintained to a preset reference time duration; and an instruction to, upon the time duration for which the abnormal state is maintained being shorter than the reference time duration, check whether a predetermined early stage diagnosis condition is satisfied based on the time duration for which the abnormal state is maintained and determine whether or not a component failure has occurred according to whether or not the early stage diagnosis condition is satisfied.

Furthermore, the at least one instruction may include an instruction to check whether the early stage diagnosis condition is satisfied, wherein the early stage diagnosis condition is defined by including at least one of a first condition in which a number of abnormal state occurrences is greater than or equal to a first predefined threshold, a second condition in which the time duration for which the abnormal state is maintained exceeds a previously stored longest time duration, and a third condition in which the time duration for which the abnormal state is maintained is longer than or equal to a second predetermined threshold.

In addition, the at least one instruction may include an instruction to count the number of abnormal state occurrences when the time duration for which the abnormal state is maintained is longer than or equal to a predetermined minimum time duration.

Here, the predetermined minimum time duration may be defined as a range of 0.4 times to 0.6 times the reference time duration.

Furthermore, the at least one instruction may include an instruction to update the longest time duration with the time duration for which the abnormal state is maintained in the instance that the time duration for which the abnormal state is maintained exceeds the previously stored longest time duration.

Meanwhile, the second threshold may be defined as a range of 0.7 times to 0.9 times the reference time duration.

Furthermore, the at least one instruction may further include an instruction to determine that a component failure has occurred in the instance that the time duration for which the abnormal state is maintained is longer than or equal to the reference time duration.

In addition, the at least one instruction may include an instruction to determine that a component failure has occurred using early stage diagnosis in the instance that the first condition, the second condition, and the third condition are satisfied even if the time duration for which the abnormal state is maintained is shorter than the reference time duration.

Meanwhile, the processor 200 may mean a central processing unit (CPU), a graphics processing unit (GPU), or a dedicated processor on which methods according to embodiments of the present invention are performed.

The processor 200 may execute at least one program command stored in the memory 100 as described above.

The diagnosing apparatus according to embodiments of the present invention has been described above. Hereinafter, a method of diagnosing a battery system performed by process operations of the diagnosing apparatus will be described.

FIG. 3 is a flowchart illustrating a method of diagnosing a battery system according to embodiments of the present invention.

Referring to FIG. 3, the diagnosing apparatus 1000 according to embodiments of the present invention may monitor the state of at least one component constituting the battery system (S1000).

To be more specific, the diagnosing apparatus 1000 may analyze at least one state data for a battery cell or battery module and at least one electrical component included in a battery system by operations of the processor 200, and monitor whether any abnormalities occur therein.

Thereafter, when an abnormal state occurs in any one component, the diagnosing apparatus 1000 may measure time duration of the abnormal state (S3000). For example, when the diagnosing apparatus 1000 receives abnormal state data for one component, the diagnosing apparatus may determine the time duration from a generation time of the abnormal state data to an end time of the abnormal state data as the time duration of the abnormal state.

According to one embodiment, the time duration of the abnormal state may mean a time continuously measured from the time when abnormal state data first occurs to the time when the abnormal state data ends.

According to another embodiment, the time duration of the abnormal state may be defined as the time duration from the first time occurrence to the last time occurrence when abnormal state data occurs more than a preset number of times.

However, the time duration of the abnormal state according to the present invention is not limited to this and may be defined based on abnormal condition data for a corresponding component.

Thereafter, the diagnosing apparatus 1000 may determine whether a component has a fault based on the measured time duration of the abnormal state (S5000). The method of determining whether a component has failed based on the time duration of the abnormal state will be described in more detail with reference to FIGS. 4 and 5 below.

FIG. 4 is a flowchart illustrating a method of determining whether a malfunction is present in the component in the method of diagnosing a battery system according to embodiments of the present invention.

Referring to FIG. 4, the diagnosing apparatus 1000 may determine whether a component has a fault by comparing the time duration of the abnormal state with a preset reference time duration.

More specifically, the diagnosing apparatus 1000 may compare the time duration of the abnormal state with a reference time duration and may determine that the component is out of order if the time duration of the abnormal state is longer than or equal to the reference time duration (S5100).

Meanwhile, if the time duration of the abnormal state is shorter than the reference time duration, the diagnosing apparatus 1000 may check whether the time duration of the abnormal state satisfies the early stage diagnosis condition (S5300).

According to an embodiment, when the time duration of the abnormal state satisfies the early stage diagnosis condition, the diagnosing apparatus 1000 may determine that the component is out of order.

According to another embodiment, if the time duration of the abnormal state does not satisfy the early stage diagnosis condition, the diagnosing apparatus 1000 may terminate the diagnosis of whether the component is out of order, return to step S1000, and continuously perform state monitoring.

FIG. 5 is a flowchart illustrating an early stage diagnosis condition in the method of diagnosing a battery system according to embodiments of the present invention.

Referring to FIG. 5, the diagnosing apparatus 1000 may check whether the time duration of the abnormal state satisfies the early stage diagnosis condition when the time duration of the abnormal state is shorter than the reference time duration, as in step S5300 described above.

Here, the early stage diagnosis condition may include at least one of the first condition, the second condition, and the third condition.

More specifically, the first condition may be defined as a state in which a number of occurrences of an abnormal state is greater than or equal to a predefined first threshold. Additionally, the second condition may be defined as a state in which the time duration of the abnormal state of the component exceeds a pre-stored longest time duration and the third condition may be defined as a state in which the time duration of the abnormal state of the component is greater than or equal to a preset second threshold.

If the first to third conditions are all satisfied (S5310, 5330, and S5350), the diagnosing apparatus 1000 may determine that a failure has occurred in the component (S5500).

FIG. 6 is a flowchart illustrating a method of diagnosing a battery system according to embodiments of the present invention.

Referring to FIG. 6, the diagnosing apparatus 1000 according to embodiments of the present invention may monitor whether an abnormal condition occurs in at least one component constituting the battery system (S100).

Thereafter, when an abnormal state occurs in any one component, the diagnosing apparatus 1000 may measure time duration of the abnormal state (S300).

The diagnosing apparatus 1000 may compare the time duration of the abnormal state (Tc) with a preset reference time (Ts) (S310).

According to one embodiment, when the time duration of the abnormal state (Tc) is greater than or equal to a reference time duration, the diagnosing apparatus may determine that the component has failed (S400).

According to another embodiment, when the time duration of the abnormal state (Tc) is less than the reference time duration, the diagnosing apparatus 1000 may check whether the time duration of the abnormal state (Tc) satisfies the early stage diagnosis condition (S330).

In more detail, the diagnosing apparatus 1000 may check whether the time duration of the abnormal state (Tc) satisfies minimum time duration (S331). Here, the minimum time duration may be set by a user based on previously generated failure history data. For example, the minimum time duration may be defined as a range from 0.4 times or more to less than 0.6 times the reference time duration. According to an embodiment, the minimum time duration may be 0.5 times the reference time duration.

Here, if the time duration of the abnormal state (Tc) satisfies the minimum time duration, the diagnosing apparatus 1000 may count a number (N) of abnormal state occurrences of the component (N=N+1) (S332).

Thereafter, the diagnosing apparatus 1000 may check whether the counted number of occurrences of the abnormal state (N) is greater than or equal to a first threshold (S333). Here, the first threshold may be set by a user. For example, the first threshold may be defined as 5 times.

When the number of occurrences of the abnormal state (N) is greater than or equal to the first threshold, the diagnosing apparatus 1000 may compare the time duration of the abnormal state ($T_C$) with the longest time duration ($T_L$) of the abnormal condition that has previously occurred in the component (S334). Here, the longest time duration ($T_L$) may be defined as the longest time duration among time durations ($T_C$) of an abnormal state that has previously occurred in the component. When the time duration ($T_C$) of the abnormal state of the component exceeds the longest maintenance time ($T_L$) previously generated in the component, the diagnosing apparatus 1000 may update the longest maintenance time ($T_L$) with the time duration ($T_C$) of the abnormal state (S335).

Thereafter, the diagnosing apparatus 1000 may check whether the longest time duration ($T_L$) is equal to or greater than a second threshold (S336). According to an embodiment, the second threshold may be defined in the range of 0.7 to 0.9 times the reference time duration. For example, the second threshold may be 0.8 times the reference time duration.

When the time duration ($T_C$) of the abnormal state exceeds the second threshold value, the diagnosing apparatus 1000 may determine that the component has a fault (S400).

Meanwhile, if any of the conditions in steps S331, S333, S334, and S336 is not satisfied, the diagnosing apparatus according to embodiments of the present invention may return to step S100 and perform state monitoring of the component.

The diagnosing apparatus and method for a battery system according to an embodiment of the present invention have been described above.

According to embodiments of the present invention, a diagnosing apparatus and method for diagnosing a failure of a component included in a battery system may monitor whether an abnormal state of the component occurs based on abnormal state data of the component, upon abnormal state occurring in the component, measure a time duration for which the abnormal state is maintained, compare the time duration for which the abnormal state is maintained to a preset reference time duration, and, upon the time duration for which the abnormal state is maintained being shorter than the reference time duration, check whether a predetermined early stage diagnosis condition is satisfied based on the time duration for which the abnormal state is maintained and determining whether or not a component failure has occurred according to whether or not the early stage diagnosis condition is satisfied, thereby enabling preemptive response by early stage diagnosis of failure even for temporary abnormal state data which lasts shorter than a preset reference time and providing high-performance, high-precision, high-efficiency, and high-reliability diagnostic devices and methods.

The operations of the method according to the embodiments of the present invention may be implemented as a computer-readable program or code on a computer-readable recording medium. The computer-readable recording medium includes all types of recording devices in which data readable by a computer system is stored. In addition, the computer-readable recording medium may be distributed in a network-connected computer system to store and execute computer-readable programs or codes in a distributed manner.

In addition, the computer-readable recording medium may include hardware devices specially configured to store and execute program instructions, such as ROM, RAM, flash memory, etc. The program instructions may include not only machine language code created by a compiler, but also high-level language code that can be executed by a computer using an interpreter.

Although some aspects of the invention have been described in the context of the apparatus, it may also represent a description according to a corresponding method, wherein a block or apparatus corresponds to a method step or feature of a method step. Similarly, aspects described in the context of a method may also represent a feature of a corresponding block or item or a corresponding apparatus. Some or all of the method steps may be performed by (or using) a hardware device, such as, for example, a microprocessor, a programmable computer, or an electronic circuit. In some embodiments, one or more of the most important method steps may be performed by such an apparatus.

In the forgoing, the present invention has been described with reference to the exemplary embodiment of the present invention, but those skilled in the art may appreciate that the present invention may be variously corrected and changed within the range without departing from the spirit and the area of the present invention described in the appending claims.

The invention claimed is:

1. A method of diagnosing a battery system, the method comprising:
- monitoring whether a component included in the battery system is in an abnormal state based on abnormal state data of the component;
- in response to the component being in the abnormal state, measuring a time duration for which the component is in the abnormal state;
- comparing the time duration for which the component is in the abnormal state to a preset reference time duration; and
- in response to the time duration for which the component is in the abnormal state being shorter than the reference time duration, determining whether a predetermined early stage diagnosis condition is satisfied according to the time duration for which the component is in the abnormal state and determining whether or not a component failure has occurred based on to whether or not the early stage diagnosis condition is satisfied.

2. The method of claim 1,
- wherein the early stage diagnosis condition includes at least one of a first condition in which a number of abnormal state occurrences is greater than or equal to a first predefined threshold, a second condition in which the time duration for which the component is in the abnormal state exceeds an updatable previously stored longest time duration, and a third condition in which the time duration for which the component is in the abnormal state is longer than or equal to a fixed second predetermined threshold.

3. The method of claim 2, wherein determining whether or not the component failure has occurred includes:
- counting the number of abnormal state occurrences for which the time duration for which the component is in the abnormal state is longer than or equal to a predetermined minimum time duration.

4. The method of claim 3, wherein the predetermined minimum time duration is a value between 0.4 times to 0.6 times the reference time duration.

5. The method of claim 2, further comprising:
- in response to the time duration for which the component is in the abnormal state exceeding the previously stored longest time duration, updating the previously stored longest time duration with the time duration for which the component is in the abnormal state.

6. The method of claim 2, wherein the second threshold is a value between 0.7 times to 0.9 times the reference time duration.

7. The method of claim 2, further comprising:
- determining that the component failure has occurred in response to the time duration for which the component is in the abnormal state is longer than or equal to the reference time duration.

8. The method of claim 2, wherein determining whether or not the component failure has occurred
- is performed using early stage diagnosis in response to the first condition, the second condition, and the third condition being satisfied regardless of whether the time duration for which the component is in the abnormal state is shorter than the reference time duration.

9. An apparatus of diagnosing a battery system, the apparatus comprising:
- at least one processor; and
- a memory configured to store instructions executed by the at least one processor,
- wherein the instructions cause the at least one processor to:
- monitor whether a component included in the battery system is in an abnormal state based on abnormal state data of the component;
- in response to the component being in the abnormal state, measure a time duration for which the component is in the abnormal state;
- compare the time duration for which the component is in the abnormal state to a preset reference time duration; and
- in response to the time duration for which the component is in the abnormal state being shorter than the reference time duration, determine whether a predetermined early stage diagnosis condition is satisfied according to the time duration for which the component is in the abnormal state and determining whether or not a component failure has occurred based on to whether or not the early stage diagnosis condition is satisfied.

10. The apparatus of claim 9,
- wherein the early stage diagnosis condition includes at least one of a first condition in which a number of abnormal state occurrences is greater than or equal to a first predefined threshold, a second condition in which the time duration for which the component is in the abnormal state exceeds an updatable previously stored longest time duration, and a third condition in which the time duration for which the component is in the abnormal state is longer than or equal to a fixed second predetermined threshold.

11. The apparatus of claim 10, wherein the instructions cause the at least one processor to:
- count the number of abnormal state occurrences for which the time duration for which the component is in the abnormal state is longer than or equal to a predetermined minimum time duration.

12. The apparatus of claim 11, wherein the predetermined minimum time duration is a value between 0.4 times to 0.6 times the reference time duration.

13. The apparatus of claim 10, wherein the instructions cause the at least one processor to:

in response to the time duration for which the component is in the abnormal state exceeding the previously stored longest time duration, update the previously stored longest time duration with the time duration for which the component is in the abnormal state.

14. The apparatus of claim 10, wherein the second threshold is a value between 0.7 times to 0.9 times the reference time duration.

15. The apparatus of claim 10, wherein the instructions cause the at least one processor to:

determine that the component failure has occurred in response to the time duration for which the component is in the abnormal state is longer than or equal to the reference time duration.

16. The apparatus of claim 10, wherein the instructions cause the at least one processor to:

determine that the component failure has occurred using early stage diagnosis in response to the first condition, the second condition, and the third condition being satisfied regardless of whether the time duration for which the component is in the abnormal state is shorter than the reference time duration.

* * * * *